United States Patent [19]

Mace et al.

[11] Patent Number: 4,772,523
[45] Date of Patent: Sep. 20, 1988

[54] STRESS RELIEF SUBSTRATE METALLIZATION

[75] Inventors: David W. Mace, Elgin; Donald O. Myers, Carpentersville, both of Ill.

[73] Assignee: Motorola, Inc., Schaumburg, Ill.

[21] Appl. No.: 25,302

[22] Filed: Mar. 13, 1987

[51] Int. Cl.$^4$ .................... B32B 15/04; H01L 23/14
[52] U.S. Cl. .................... 428/630; 428/666; 428/672; 428/680; 357/26; 357/68; 357/74
[58] Field of Search ............ 428/630, 645, 666, 672, 428/680, 404; 357/26, 68, 74

[56] References Cited

U.S. PATENT DOCUMENTS

| | | | |
|---|---|---|---|
| 3,409,809 | 11/1968 | Diehl | 428/672 |
| 3,904,488 | 9/1975 | Nosker et al. | 428/672 |
| 4,384,899 | 5/1983 | Myers | 148/1.5 |

OTHER PUBLICATIONS

*IBM'* Technical Disclosure Bulletin, vol. 15, No. 10, Mar. 1973.
Hackh's *Chemical Dictionary*, 4th ed., Julius Grant editor, McGraw Hill, New York, 1969, p. 422.
Webster's *Ninth New Collegiate Dictionary*, Merriam-Webster, Inc., Springfield, Mass., 1985, p. 746.

*Primary Examiner*—L. Dewayne Rutledge
*Assistant Examiner*—George Wyszomierski
*Attorney, Agent, or Firm*—Phillip H. Melamed

[57] ABSTRACT

A technique for metallizing a substrate while providing stress relief for the metallization on the substrate is disclosed. Chrome conductive metallization (22) is deposited on a top surface (21) of an insulating glass substrate (20). An interior gold conductive metallization (23) is deposited on the chrome, and metallization (24) having a substantial nickel composition is deposited on the gold. Subsequently, an additional outer gold metallization (25) is provided on the nickel, and solder is provided on the additional gold metallization. Prior to the application of solder to the outer gold layer 25, the metallization layers are subjected to anodic bonding temperatures and voltage potentials. The gold layer between the nickel and chrome layers diffuses along the grain boundaries of the nickel and chrome layers, thus reducing the ability to transmit stress through these metallizations induced by the solder. The present metallization structure prevents solder-induced stress from rupturing either the bond between the chrome layer and glass substrate or the glass substrate. This allows application of a relatively thick layer of chrome to glass sufficient such that chrome can be deposited in feedthrough holes (31, 32) in the glass. Preferably, such a metallization technique is utilized for manufacturing a silicon capacitive pressure sensor (30).

20 Claims, 1 Drawing Sheet

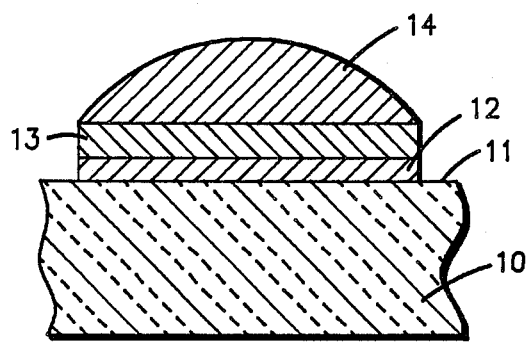
FIG. 1
—PRIOR ART—
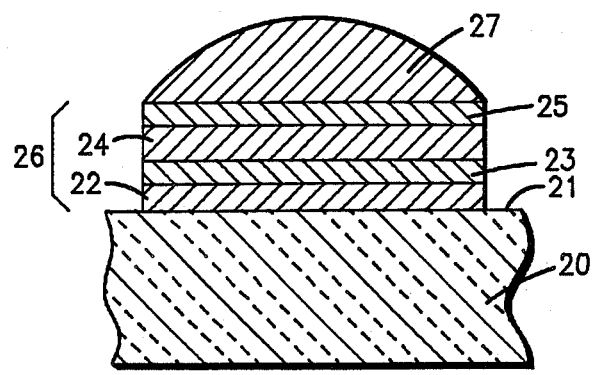
FIG. 2
FIG. 3
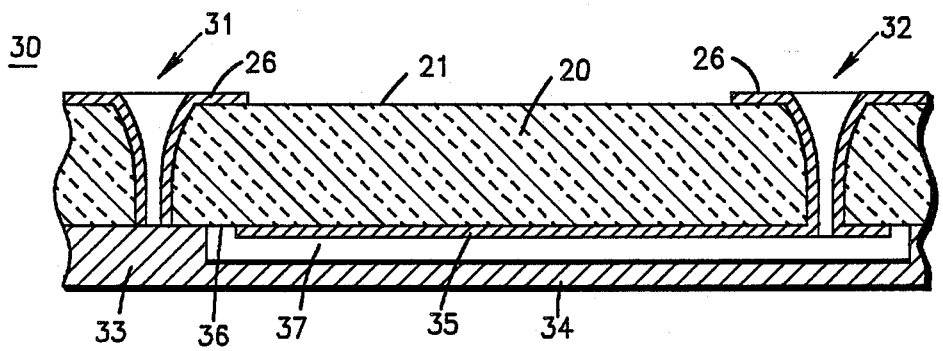
FIG. 4
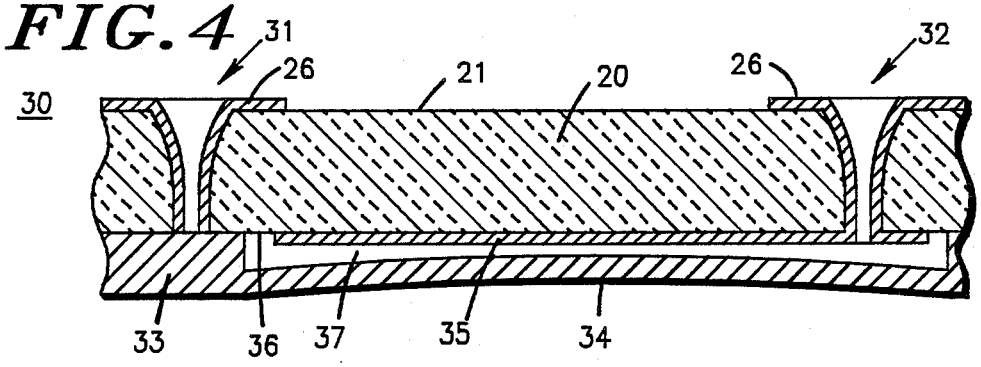

STRESS RELIEF SUBSTRATE METALLIZATION

BACKGROUND OF THE INVENTION

In manufacturing capacitive pressure transducers, it is sometimes necessary to provide conductive through-hole metallization in holes in an insulating substrate. This necessitates providing a relatively thick layer of conductive metallization onto to a top surface of the substrate such that the metallization will also be provided in through holes therein. U.S. Pat. No. 4,384,899 illustrates such a capacitive pressure transducer utilizing a glass base substrate and conductive metallizations applied thereto to provide through-hole conductive paths. The pressure transducer illustrated in this patent comprises a silicon diaphragm forming one capacitive electrode which cooperates with another capacitive electrode comprising a metallization on a surface of a glass base substrate. In response to sensed pressure, the silicon diaphragm deflects and charges the capacitance between the diaphragm and the metallized glass base substrate.

In substrate metallization systems such as that discussed above, typically it is also necessary to solder to the metallization applied to the base substrate. Typically, the solder thermal coefficient of expansion is vastly dissimilar from the glass base substrate, and reliability problems are encountered due to the transmission of stress from the solder through the metallization to the metallization and glass base substrate interface. This problem becomes more severe when a relatively thick metallization layer is applied to the substrate, such as when feed through holes in the substrate are to be metallized. When solder is then applied to such a thick metallization layer, the result is often the eventual rupturing of the bond between the metallization and the insulating substrate or rupturing of the insulating substrate.

SUMMARY OF THE PRESENT INVENTION

An object of the present invention is to provide a stress relief substrate metallization whereby stress is inhibited from being transmitted from an outer solder layer to an inner metallization layer deposited on an insulating substrate.

In one embodiment of the present invention, a metallized substrate is provided. The metallized substrate comprises: an insulating base substrate having a top surface; a first metallization layer of a first composition deposited on said top surface; a second metallization layer of a second composition deposited on said first metallization layer; and a third metallization layer deposited on said second metallization layer, said second metallization layer comprising a metallization layer substantially more malleable with respect to said first and/or third metallization layers, whereby stress is inhibited from being transmitted from said third metallization layer to said first metallization layer. More specifically, said second metallization layer, between said first and third metallization layers, comprises a gold metallization layer (Au).

Essentially, the present invention involves utilizing an interim gold layer between a first conductive metallization applied to an insulating substrate and a third conductive metallization which will be coupled to a solder layer. Preferably, the first metallization is chrome (Cr), and the third metallization is nickel (Ni) or a nickel alloy. It is contemplated that an additional outer gold layer is deposited on top of the nickel metallization and that the base substrate comprises glass or some equivalent material. The preceding structure is then subjected to the temperatures and voltage potentials of anodic bonding, preferably to bond a silicon diaphragm to the metallized glass substrate so as to form a capacitive sensor. Then solder is applied to the outer gold layer, but the interim gold layer prevents the transmitting of solder stress to the chrome-glass interface. Preferably, the base substrate has holes therein with the chrome layer providing conductive metallization in these holes, thus requiring the chrome layer to have a thickness in excess of 700 angstroms. With such a relatively thick chrome layer, typically reliability problems have been encountered in the past when no stress relief gold interim layer was provided. However, with the provision of such a gold layer between the chrome and nickel layers, improved reliability has been achieved.

BRIEF DESCRIPTION OF THE DRAWINGS

For a more complete understanding of the present invention, reference should be made to the drawings, in which:

FIG. 1 is a cross sectional view of a portion of a prior art metallized substrate;

FIG. 2 is a cross sectional view of a portion of a metallized substrate constructed in accordance with the teachings of th present invention;

FIG. 3 is a cross sectional view of a portion of a silicon capacitive pressure transducer constructed in accordance with the metallization system of the present invention; and FIG. 4 is a cross sectional view of the pressure transducer of FIG. 3 showing diaphragm deflection in response to the application of sensed pressure.

DESCRIPTION OF THE PREFERRED EMBODIMENTS

Referring to FIG. 1, a prior substrate metallization system is illustrated comprising a glass base substrate 10 having a top surface 11. A chrome metallization layer 12 is deposited on the top surface 11, and a nickel metallization layer 13 is deposited on the chrome metallization layer 12. Preferably the nickel layer 13 comprises the nickel alloy nickel-vanadium containing seven percent (7%) vanadium. This layer, therefore, has a substantial nickel composition. A gold-solder alloy 14 is illustrated as being deposited on the nickel metallization layer 13. Preferably, the gold-solder alloy 14 results from applying a gold metallization layer directly on top of the nickel metallization layer 13, and then applying a solder layer on top of the gold layer resulting in the creation of the gold-solder alloy 14.

For prior art metallization systems such as that shown in FIG. 1, it has been noted that the solder 14 can induce stress through the nickel layer so as to either rupture the bond between the chrome metallization layer 12 and the top surface 11 of the glass or rupture the glass substrate 10. This problem greatly increases when the thickness of the chrome layer 12 is greater than 700 angstroms. When it is necessary to provide conductive metallization in through holes in the glass substrate 10, a relatively thick chrome layer 12 of 700 angstroms or more must be applied to insure metallization in such through holes, and this results in reliability problems for the metallization system shown in FIG. 1.

According to the teachings of the present invention, the improved metallization system shown in FIG. 2 should be utilized. This improved metallization system consists of a glass substrate 20 having a top surface 21. A conductive metallization chrome layer 22 is then deposited on the top surface 21 wherein the chrome layer is at least 700 angstroms in thickness and will typically be between 800 to 1200 angstroms in thickness.

According to the present invention, a conductive gold interim metallization layer 23 is provided on top of the chrome layer 22 wherein the metallization layer 23 is substantially more malleable than the chrome metallization layer 22. Typically, the gold metallization layer 23 has a thickness of approximately 1000 angstroms. On top of the gold interim metallization layer 23, a nickel conductive metallization layer 24 is deposited having a thickness of approximately 3000 angstroms, and on top of the nickel metallization layer, an outer gold metallization layer 25 having a thickness of also approximately 3000 angstroms is deposited. Preferably the nickel layer 24 comprises the nickel alloy nickel-vanadium. The composite metallization comprising the layers 22–25 is designated in FIG. 2 by reference number 26. Subsequently, the metallization system, as previously described, is subjected to anodic bonding temperatures and voltage potentials since it is contemplated that this metallization system is utilized in the production of silicon capacitive pressure sensors such as those shown in U.S. Pat. No. 4,384,899.

It appears that during the anodic bonding process, the gold interim metallization layer 23 will diffuse into grain boundaries of the nickel and chrome metallization layers, thus reducing the ability of these metallization layers to transmit stress therethrough which may be induced by a solder layer 27 to be applied to the outer gold metallization layer 25. The gold layer 23 is substantially more malleable than either the chrome or nickel layers, and this appears to inhibit the transmission of stress through these layers. The solder layer 27 is shown in FIG. 2 and essentially comprises, preferably, a 10/90 (Sn-Pb, tin-lead) solder which is applied to the gold metallization layer 25. When the solder is applied to the gold metallization layer 25, a gold-solder alloy, such as the alloy 14 shown in FIG. 1, is formed. However, due to the presence of the malleable gold interim layer 23, stresses of this solder alloy will not be readily transmitted through the nickel and chrome metallization layers to the glass substrate top surface 21. This means that a thick chrome metallization layer 22 can now be reliably deposited on the surface 21 for providing conductive feedthrough connections through the glass substrate. This is now achievable without any substantial rupturing of the chrome-to-glass interface or rupturing of the glass substrate due to solder-transmitted stress caused by the dissimilar thermal expansion coefficient of solder versus the glass substrate. Thus, a much more reliable substrate metallization has been provided than the prior art system shown in FIG. 1.

Preferably, the substrate metallization system of the present invention is utilized to manufacture silicon capacitive pressure transducers such as those shown in FIGS. 3 and 4 and as described in U.S. Pat. No. 4,384,899 assigned to the assignee of the present invention. FIG. 3 illustrates one such pressure transducer shown in cross section without any pressure applied thereto. In FIG. 3, a pressure transducer 30 is illustrated comprising the glass substrate 20 and the composite metallization layer 26 comprising at least the individual metallization layers 22 through 25.

In FIG. 3 it is noted that feedthrough holes 31 and 32 are provided in the substrate 20 with the composite metallization 26 being deposited therein. In addition, a silicon diaphragm 33 is anodically bonded (at high temperature and with substantial voltage potential being applied) to the glass base substrate 20 in FIG. 3. The diaphragm 33 has a reduced thickness diaphragm section 34 that is capable of deflection towards a metallization layer 35 on a bottom surface 36 of the substrate 20 opposite to the top surface 21 shown in FIG. 3. In response to a sensed pressure, the diaphragm portion 34 will deflect towards the metallization 35 and alter the capacitance between these elements wherein the change in capacitance will be related to the sensed pressure. This change in capacitance is then monitored by external electronic circuitry (not shown) to develop an electrical signal related to the change in capacitance and, therefore, related to the sensed pressure.

FIG. 4 illustrates the pressure transducer 30 shown in FIG. 3 with the diaphragm 34 being deflected in response to sensed pressure.

It should be noted that, if desired, one of the feedthrough holes designated as hole 32 in FIG. 3 can be sealed such that an absolute pressure sensor, rather than a relative pressure sensor, is provided. In that case, a predetermined reference pressure is stored in a cavity 37 shown in FIG. 3. However, this does not form any aspect of the present invention.

What is significant is that the solder 27 will be applied to the composite metallization 26 in FIG. 3, preferably after anodic bonding of the silicon diaphragm and glass substrate, and that the solder will not induce excessive stress to the chrome-glass interface due to dissimilarity of thermal expansion between the solder 27 and the glass substrate 20.

While the present invention has been described in terms of a chrome layer deposited directly on a glass substrate, obviously other metallization layers may be present between the chrome layer 22 and the surface 21. In addition, other metallization layers other than chrome, such as titanium tungsten (TiW or nichrome—a nickel-chrome alloy) could be utilized. In addition, instead of the nickel layer 24, a copper metallization layer could also be possibly used. While conductive metallizations have been described herein, some nonconductive metallizations may also be used. The term "metallization" as used herein refers to any metal layer of material applied to a substrate.

Extensive test data of the present invention has been taken, and it has been noted that with the metallization system of the present invention, as opposed to the prior art system shown in FIG. 1, substantial reliability improvement was achieved.

While we have shown and described specific embodiments of this invention, further modifications and improvements will occur to those skilled in the art. All such modifications which retain the basic underlying principles disclosed and claimed herein are within the scope of this invention.

We claim:

1. A metallized electric circuit device substrate comprising:
   an insulating base substrate having a top surface;
   a first metallization layer of a first composition deposited on said top surface;

a second metallization layer of a second composition deposited on said first metallization;

a third metallization layer deposited on said second metallization layer; and a solder layer applied on top of said third metallization layer.

said second metallization layer comprising a metallization layer substantially more malleable with respect to said first and/or third metallization layers, whereby stress is inhibited from being transmitted from said third metallization layer to said first metallization layer, wherein said second metallization layer comprises an interim gold metallization layer.

2. A metallized substrate according to claim 1 wherein said first metallization layer comprises a chrome metallization layer.

3. A metallized substrate according to claim 2 wherein said third metallization layer comprises at least a metallization layer having a substantial nickel composition.

4. A metallized substrate according to claim 3 wherein said insulating base substrate comprises a glass substrate.

5. A metallized substrate according to claim 4 wherein a gold metallization layer is deposited between said solder layer and said nickel metallization layer.

6. A metallized substrate according to claim 5 wherein said chrome layer has a thickness of at least 700 angstroms.

7. A metallized substrate according to claim 6 wherein said glass has feedthrough holes therein, and wherein at least said first metallization layer is deposited therein to provide a conductive feedthrough.

8. A metallized substrate according to claim 7 wherein said substrate comprises an element of a pressure transducer having a silicon diaphragm anodically bonded thereto.

9. A metallized substrate according to claim 1 wherein said first and third metallization layers are in direct contact with said second metallization layer, wherein said first metallization layer is a chrome metallization layer and wherein said third metallization layer has a substantial nickel composition.

10. A metallized substrate according to claim 1 wherein said first metallization layer comprises a chrome metallization layer in direct contact with said gold metallization layer and wherein said chrome metallization layer has a thickness of at least 700 angstroms.

11. An electric circuit device substrate metallization method comprising the steps of:

providing an insulating base substrate having a top surface;

depositing a first metallization layer of a first composition on said top surface; then depositing a second metallization layer of a second composition on said first metallization layer; then depositing a third metallization layer on said second metallization layer; and then depositing a solder layer on top of said third metallization layer, said second metallization layer comprising a metallization layer substantially more malleable with respect to said first and/or third metallization layers, whereby stress is inhibited from being transmitted from said third metallization layer to said first metallization layer, wherein said second metallization layer comprises an interim gold metallization layer.

12. A substrate metallization method according to claim 1 wherein said first metallization layer comprises a chrome metallization layer.

13. A substrate metallization method according to claim 12 wherein said third metallization layer comprises at least a metallization layer having a substantial nickel composition.

14. A substrate metallization method according to claim 13 wherein said insulating base substrate comprises a glass substrate.

15. A substrate metallization method according to claim 14 which includes the step of depositing a gold metallization layer between said solder layer and said nickel metallization layer.

16. A substrate metallization method according to claim 15 wherein said chrome layer has a thickness of at least 700 angstroms.

17. A substrate metallization method according to claim 16 wherein said glass substrate has feedthrough holes therein, and wherein said step of depositing said first metallization layer deposits in said holes said first metallization layer to provide a conductive feedthrough.

18. A substrate metallization method according to claim 11 wherein prior to the step of applying solder, said substrate is anodically bonded to another structure.

19. A substrate metallization method according to claim 11 wherein said first and third metallization layers are in direct contact with said second metallization layer, wherein said first metallization layer is a chrome metallization layer and wherein said third metallization layer has a substantial nickel composition.

20. A substrate metallization method according to claim 11 wherein said first metallization layer comprises a chorme metallization layer in direct contact with said gold metallization layer and wherein said chrome metallization layer has a thickness of at least 700 angstroms.

* * * * *